United States Patent
Watanabe et al.

(10) Patent No.: US 11,909,158 B2
(45) Date of Patent: Feb. 20, 2024

(54) CIRCUIT BOARD FIXING STRUCTURE AND LIGHT IRRADIATION DEVICE HAVING SAME

(71) Applicant: HOYA CANDEO OPTRONICS CORPORATION, Toda (JP)

(72) Inventors: Hiroaki Watanabe, Toda (JP); Katsumi Ashida, Toda (JP)

(73) Assignee: HOYA CORPORATION, Tokyo (JP)

( * ) Notice: Subject to any disclaimer, the term of this patent is extended or adjusted under 35 U.S.C. 154(b) by 581 days.

(21) Appl. No.: 16/775,232

(22) Filed: Jan. 28, 2020

(65) Prior Publication Data

US 2020/0244024 A1 Jul. 30, 2020

(30) Foreign Application Priority Data

Jan. 30, 2019 (JP) .................................. 2019-014913

(51) Int. Cl.
*H05K 1/02* (2006.01)
*H05K 1/11* (2006.01)
(Continued)

(52) U.S. Cl.
CPC ............ *H01R 43/015* (2013.01); *H01R 4/26* (2013.01); *H05K 1/0203* (2013.01); *H05K 1/111* (2013.01); *H05K 1/181* (2013.01); *H05K 1/0306* (2013.01)

(58) Field of Classification Search
CPC ...... H01R 43/015; H01R 4/26; H05K 1/0203; H05K 1/181; H05K 3/0061; H05K 1/0306;
(Continued)

(56) References Cited

U.S. PATENT DOCUMENTS

| 7,582,959 B2 * | 9/2009 | Fukusako ............ H05K 3/0061 |
| | | 257/E23.079 |
| 9,041,196 B2 * | 5/2015 | Bayerer ................ H05K 1/141 |
| | | 257/E23.083 |

(Continued)

FOREIGN PATENT DOCUMENTS

| AT | WO20140346579 | * | 3/2014 |
| CN | 201181425 Y | | 1/2009 |

(Continued)

OTHER PUBLICATIONS

Chinese Second Office Action dated May 4, 2023, in the counterpart Chinese Patent Application No. 202010070944.1.

*Primary Examiner* — Ishwarbhai B Patel
(74) *Attorney, Agent, or Firm* — Rabin & Berdo, P.C.

(57) ABSTRACT

Provided is a small-sized circuit board fixing structure capable of enabling a circuit board on a base to be easily replaced. A circuit board fixing structure configured to fix a circuit board onto a surface of a base includes a wire pattern formed on a surface of the circuit board, a first through hole penetrating from a front surface to a rear surface of the circuit board, a second through hole penetrating from a front surface to a rear surface of the base so as to communicate with the first through hole, an electrode penetratively inserted into the second through hole, and a fixing member engaged with the electrode mounted on the surface of the circuit board and configured to fix the circuit board to the base, in which when the fixing member and the electrode are engaged, the wire pattern and the electrode are electrically connected through the fixing member.

20 Claims, 5 Drawing Sheets

(51) Int. Cl.
*H05K 1/18* (2006.01)
*H01R 43/01* (2006.01)
*H01R 4/26* (2006.01)
*H05K 1/03* (2006.01)

(58) Field of Classification Search
CPC ....... H05K 3/4046; H05K 2201/10106; H05K 2201/10409; H05K 7/1417; F21V 19/003; F21V 19/0055; F21V 23/06; F21V 29/70; F21Y 2115/10
See application file for complete search history.

(56) References Cited

U.S. PATENT DOCUMENTS

| | | |
|---|---|---|
| 2007/0236935 A1 | 10/2007 | Wang |
| 2011/0043120 A1* | 2/2011 | Panagotacos .......... B64D 47/04 315/294 |
| 2011/0298112 A1* | 12/2011 | Mori ..................... H05K 3/202 257/676 |
| 2012/0058390 A1 | 3/2012 | Obayashi |
| 2015/0271910 A1* | 9/2015 | Kinoshita ................ H01R 4/34 174/261 |
| 2017/0167713 A1* | 6/2017 | Hong ..................... F21S 2/005 |

FOREIGN PATENT DOCUMENTS

| | | |
|---|---|---|
| CN | 102386368 A | 3/2012 |
| CN | 204829426 U | 12/2015 |
| CN | 205504596 U | 8/2016 |
| JP | 2012043571 A | 3/2012 |
| JP | 2012069396 A | 4/2012 |
| JP | 2015028915 A | 2/2015 |
| JP | 2017117736 A | 6/2017 |
| KR | 20030005800 A | 1/2003 |
| TW | M381747 U | 6/2010 |

* cited by examiner

CIRCUIT BOARD FIXING STRUCTURE AND LIGHT IRRADIATION DEVICE HAVING SAME

TECHNICAL FIELD

The present disclosure relates to a circuit board fixing structure configured to fix a circuit board on a base (e.g., a heat sink or a base plate), and particularly, to a circuit board fixing structure having an electrode configured to both fix a circuit board and supply power, and a light irradiation device having the same.

BACKGROUND ART

In the related art, ultraviolet curable ink, which is cured by being irradiated with ultraviolet rays, is used as ink for sheet-fed offset printing. In addition, ultraviolet curable resin is used as a sealing agent for a flat panel display (FPD) such as a liquid crystal panel or an organic EL (electroluminescence) panel. In general, a light irradiation device configured to emit ultraviolet rays is used to cure the ultraviolet curable ink or the ultraviolet curable resin (for example, Patent Document 1).

The light irradiation device disclosed in Patent Document 1 has a heat sink, multiple light source modules fixed onto the heat sink, and a terminal block fixed to a side surface of the heat sink. The respective light source modules have electrode plates disposed to protrude toward the terminal block, and electric power is supplied to the respective light source modules as the respective electrode plates are fixed to the terminal block. In addition, fixing plates configured to press boards of the light source modules are disposed to cover the respective electrode plates, and the respective fixing plates and the respective electrode plates are fastened together to the terminal block, such that the respective light source modules are fixed onto the heat sink.

DOCUMENT OF RELATED ART

Patent Document

[Patent Document 1] Japanese Patent Application Laid-Open No. 2015-28915

DISCLOSURE

Technical Problem

In the light irradiation device disclosed in Patent Document 1, the electrode plate and the fixing plate are separately provided to stably supply electric power to the light source module and fix the light source module without applying excessive stress. However, since the electrode plate and the fixing plate protrude toward the terminal block (i.e., protrude toward the outside of the light source module), there is a problem in that a size in a direction orthogonal to a direction in which the light source modules are arranged is increased (i.e., the thickness cannot be reduced). In addition, when the light source module is required to be replaced such as in the event of a breakdown of the light source module, the fixing plate also needs to be detached, and as a result, there is a need for a configuration capable of simply performing the operation of replacing the light source module.

The present disclosure has been made in consideration of the above-mentioned circumstances, and an object of the present disclosure is to provide a small-sized circuit board fixing structure enabling a circuit board (a light source module or the like) on a base (a heat sink or the like) to be easily replaced. In addition, another object of the present disclosure is to provide a light irradiation device having the circuit board fixing structure.

Technical Solution

In order to achieve the above-mentioned objects, a circuit board fixing structure according to the present disclosure is a circuit board fixing structure configured to fix a circuit board onto a surface of a base, the circuit board fixing structure including a wire pattern formed on a surface of the circuit board, a first through hole penetrating from a front surface to a rear surface of the circuit board, a second through hole penetrating from a front surface to a rear surface of the base so as to communicate with the first through hole, an electrode penetratively inserted into the second through hole, and a fixing member engaged with the electrode mounted on the surface of the circuit board and configured to fix the circuit board to the base, in which when the fixing member and the electrode are engaged, the wire pattern and the electrode are electrically connected through the fixing member.

According to the configuration, since the electrode serves to both fix the circuit board and supply electric power, the circuit board may be downsized without providing a member dedicated to supplying electric power to the circuit board like the related art.

In addition, an end of the electrode at the side of the circuit board may be configured to be fitted with the first through hole.

In addition, the base may have conductivity and may further have, in the second through hole, an insulating member configured to insulate the electrode and the base. In addition, in this case, the multiple electrodes may be provided, and the insulating member may be formed to support the multiple electrodes.

In addition, the base may have insulation.

In addition, the fixing member may be a screw, and the electrode may have a screw hole thread-coupled to the screw.

In addition, the base may be a heat sink configured to cool the circuit board.

In addition, from another point of view, a light irradiation device of the present disclosure may include the above-mentioned circuit board fixing structure, and multiple light emitting elements disposed on the circuit board. In addition, in this case, the light emitted from the light emitting element may be light having a wavelength in an ultraviolet region.

Advantageous Effects

As described above, according to the present disclosure, the small-sized circuit board fixing structure enabling the circuit board on the base to be easily replaced is implemented. In addition, the light irradiation device having the circuit board fixing structure is implemented.

DESCRIPTION OF MAIN REFERENCE NUMERALS OF DRAWINGS 1, 2, 3, 4: Light irradiation device
10, 20, 30, 40: Circuit board fixing structure
100: LED module
105: Board
110: LED element
120: Through hole
200, 200A, 200C: Heat sink
210, 210C: Through hole
230, 240: Flow path
250: Refrigerant supply connector
260: Refrigerant discharge connector
300, 300B, 300C: Electrode terminal
300a, 300Ca: Anode terminal
300b, 300Cb: Cathode terminal
310, 310B: Electrode rod
310a: Screw hole portion
311: Screw portion
320: Fixing screw
320a: Screw portion
321: Nut
325: Washer
330, 330B: Insulating sleeve
330C: Insulating member
AP: Anode pattern
KP: Cathode pattern

BEST MODE

Hereinafter, exemplary embodiments of the present disclosure will be described in detail with reference to the drawings. Further, in the drawings, identical or equivalent constituent elements are denoted by the same reference numerals, and descriptions thereof will be omitted.

First Exemplary Embodiment

Figure 1:
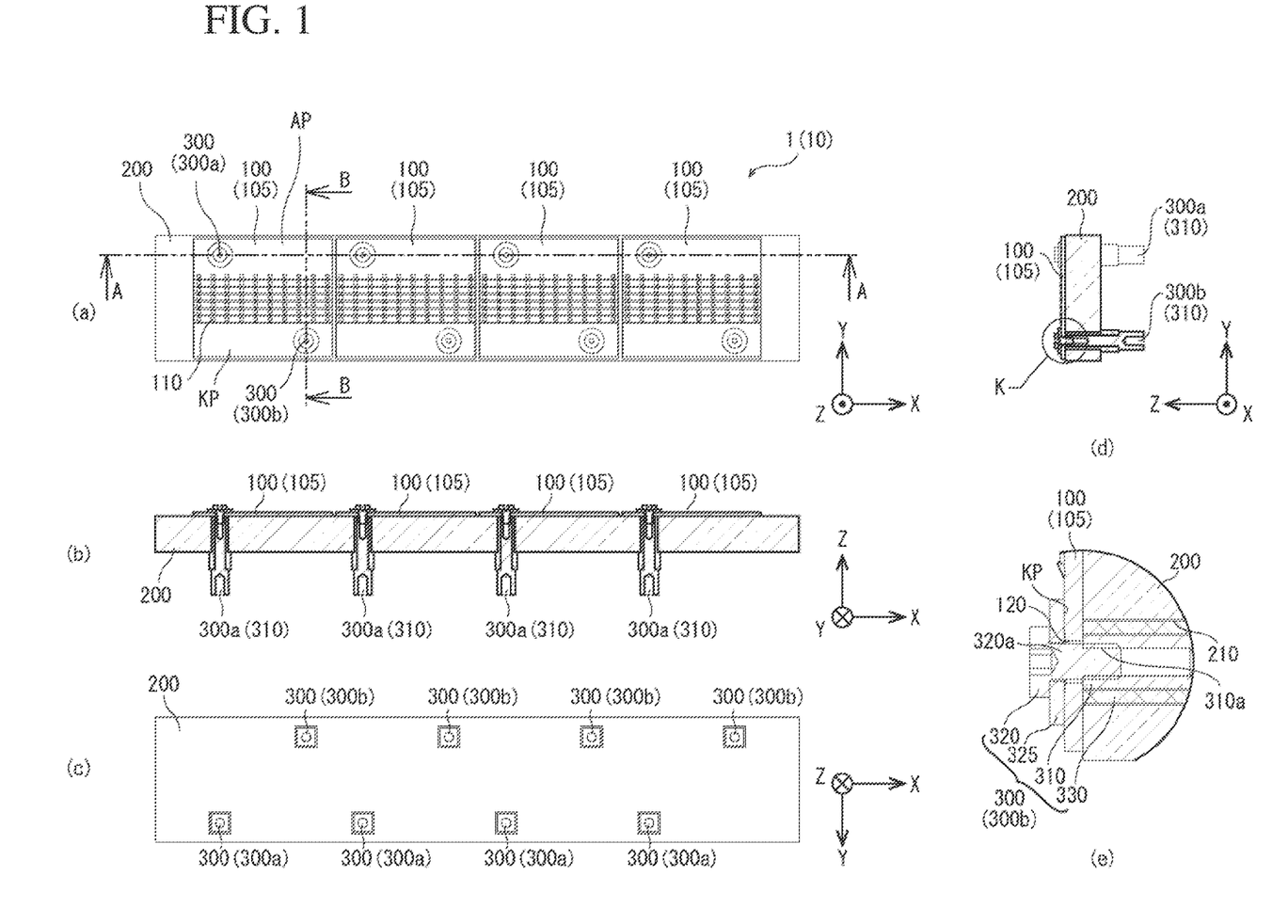
FIG. 1 is a view for explaining a schematic configuration of a light irradiation device having a circuit board fixing structure according to a first exemplary embodiment of the present disclosure.

FIG. 1 is a view for explaining a schematic configuration of a light irradiation device 1 having a circuit board fixing structure 10 according to a first exemplary embodiment of the present disclosure, in which FIG. 1A is a front view, FIG. 1B is a cross-sectional view taken along line A-A in FIG. 1A, FIG. 1C is a rear view, FIG. 1D is a cross-sectional view taken along line B-B in FIG. 1A, and FIG. 1E is an enlarged view of part K in FIG. 1D.

The light irradiation device 1 of the present exemplary embodiment is a light source device mounted on a printing device or the like and configured to cure ultraviolet curable ink or ultraviolet curable resin. For example, the light irradiation device 1 is disposed above a target object so that a front side of the light irradiation device 1 (a side at which LED modules 100 are disposed) is directed toward the target object, and the light irradiation device 1 emits ultraviolet rays downward toward the target object. Further, in the present specification, as illustrated in FIG. 1, the description will be made assuming that a direction in which a light emitting diode (LED) element 110 emits ultraviolet rays is defined as a Z-axis direction, a longitudinal direction of the light irradiation device 1 is defined as an X-axis direction, and a direction (a transverse direction of the light irradiation device 1) orthogonal to the Z-axis direction and the X-axis direction is defined as a Y-axis direction. In addition, in general, the ultraviolet ray is considered as meaning light having a wavelength of 400 nm or less. However, in the present specification, the ultraviolet ray means light having a wavelength (e.g., a wavelength of 250 to 420 nm) capable of curing the ultraviolet curable ink.

As illustrated in FIG. 1, the light irradiation device 1 of the present exemplary embodiment has four LED modules 100, a heat sink (base) 200, an anode terminal 300a and a cathode terminal 300b configured to supply electric power to the respective LED modules 100, and a box-shaped casing (not illustrated) made of metal and configured to accommodate the LED modules 100, the heat sink (base) 200, the anode terminal 300a, and the cathode terminal 300b. Further, in the present specification, the anode terminal 300a and the cathode terminal 300b are collectively called an electrode terminal (electrode) 300.

The LED module 100 has a board 105 (circuit board) having a rectangular shape defined in the X-axis direction and the Y-axis direction, and multiple LED elements (light emitting elements) 110 on the board 105, and the four LED modules 100 are disposed and fixed on one end surface of the heat sink 200 (see FIG. 1A). For example, the board 105 is a ceramics board made of aluminum nitride having high thermal conductivity, and in each of the boards 105, a pair of through holes 120 (first through holes) is formed at positions corresponding to the electrode terminals 300 (FIG. 1E). Further, in the present exemplary embodiment, thermal grease (not illustrated) is applied onto a surface (placement surface) of the heat sink 200, and the board 105 is then mounted on the heat sink 200, such that the thermal grease is interposed between a rear surface of the board 105 and the heat sink 200 to increase adhesion between the board 105 and the heat sink 200.

The LED module 100 has the 70 LED elements 110 disposed on the board 105 in a mode of 7 rows (Y-axis direction)×10 LED elements (X-axis direction). The 70 LED elements 110 are disposed on the surface of the board 105 in a state in which optical axes thereof are aligned with the Z-axis direction. An anode pattern AP and a cathode pattern KP are formed on the surface of the board 105 to supply electric power to each of the LED elements 110. Each of the LED elements 110 is electrically connected to one end of the anode pattern AP and one end of the cathode pattern KP by soldering (e.g., by a conductive adhesive (silver paste), a brazing material, welding, fusion welding, diffusion bonding, or the like). In addition, in the present exemplary embodiment, the anode pattern AP is electrically connected to an electrode rod 310 of the anode terminal 300a, and the cathode pattern KP is electrically connected to an electrode rod 310 of the cathode terminal 300b (the details are to be described below). Further, the electrode rods 310 of the anode terminal 300a and the cathode terminal 300b are electrically connected to a non-illustrated driver circuit, and a drive current is supplied from a driver circuit to the respective LED elements 110 through the anode terminal 300a, the cathode terminal 300b, the anode pattern AP, and the cathode pattern KP. When the drive current is supplied to each of the LED elements 110, the ultraviolet rays (having a wavelength of 385 nm, for example) corresponding in light amount to the drive current are emitted from each of the LED elements 110. Further, the drive current to be supplied to each of the LED elements 110 is adjusted so that each of the LED elements 110 of the present exemplary embodiment emits the ultraviolet rays with approximately the same light amount, and the ultraviolet rays emitted from the light irradiation device 1 have approximately uniform light intensity distributions in the X-axis direction and the Y-axis direction.

The heat sink 200 is a plate-shaped member made of metal (e.g., copper or aluminum) and configured to dissipate heat generated from each of the LED modules 100, and the heat sink 200 is installed such that the surface of the heat sink 200 adjoins the rear surface of the board 105 of each of the LED modules 100. In addition, rectangular through holes 210 (second through holes) are formed to penetrate a front surface and a rear surface of the heat sink 200 so as to communicate with the through holes 120 of the board 105, and the electrode terminal 300 is penetratively inserted into the through hole 210 (FIGS. 1B, 1D, and 1E).

As described above, the electrode terminal 300 of the present exemplary embodiment has the anode terminal 300a connected to the anode pattern AP, and the cathode terminal 300b connected to the cathode pattern KP. However, because the anode terminal 300a and the cathode terminal 300b are identical to each other in terms of a specific configuration, the cathode terminal 300b will be representatively described below. As illustrated in FIG. 1E, the cathode terminal 300b (electrode terminal 300) includes the electrode rod 310, a fixing screw 320, a washer 325, and an insulating sleeve 330.

Figure 2:
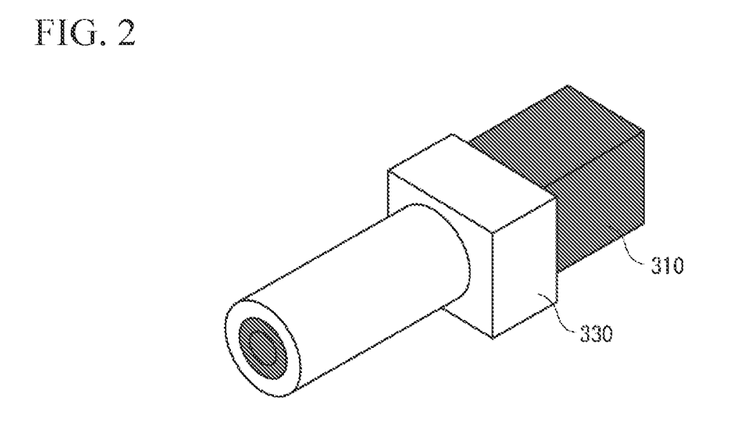
FIG. 2 is a perspective view for explaining configurations of an electrode rod and an insulating sleeve of the circuit board fixing structure according to the first exemplary embodiment of the present disclosure.

FIG. 2 is a perspective view illustrating a state in which the electrode rod 310 and the insulating sleeve 330 are assembled. As illustrated in FIG. 2, the electrode rod 310 is a metallic member having a cylindrical tip portion and a quadrangular columnar base end and penetratively inserted into the insulating sleeve 330 which is made of resin and similarly has a cylindrical tip portion and a quadrangular cylindrical base end (i.e., the insulating sleeve 330 is mounted in an outer circumferential surface of the electrode rod 310), and the electrode rod 310 is inserted into the through hole 210 of the heat sink 200. Further, when the electrode rod 310 is mounted in the through hole 210, a tip of the electrode rod 310 and a tip of the insulating sleeve 330 are positioned on approximately the same plane as a surface (placement surface) of the heat sink 200 or positioned to be slightly recessed from the surface of the heat sink 200 (FIG. 1E). A base end of the electrode rod 310 and the base end of the insulating sleeve 330 are disposed to protrude from the rear surface of the heat sink 200 (FIG. 1B). In this way, the light irradiation device 1 of the present exemplary embodiment is assembled in the state in which the electrode rods 310 and the insulating sleeves 330 are mounted in the through holes 210. That is, the heat sink 200, in which the electrode rods 310 and the insulating sleeves 330 are mounted in the through holes 210, is prepared, the thermal grease is applied onto the surface (placement surface) of the heat sink 200, and the respective LED modules 100 are placed on the heat sink 200. Further, the alignment is performed so that the through holes 120 of the boards 105 are positioned above (in a Z-axis direction) the electrode rods 310 (i.e., so that the through holes 120 communicate with the through holes 210), and the washers 325 and the fixing screws 320 are mounted in the through holes 120. When the washer 325 and the fixing screw 320 are mounted in the through hole 120, a screw portion 320a of the fixing screw 320 is thread-coupled to a screw hole portion 310a formed in an inner circumferential surface of the electrode rod 310, and the LED module 100 is fixed by being interposed between the washer 325 and the heat sink 200 (FIG. 1E). Further, when the LED module 100 is fixed by the fixing screw 320, the cathode pattern KP, the washer 325, and the fixing screw 320 are electrically connected to the electrode rod 310. Therefore, when the drive current is supplied from the driver circuit connected to the electrode rod 310, the drive current is supplied to each of the LED elements 110 through the cathode pattern KP.

In this way, in the present exemplary embodiment, the electrode terminal 300 serves to both fix the board 105 and supply electric power. Therefore, it is possible to downsize the LED module 100 without providing a member dedicated to supplying electric power to the board 105. In addition, even in a case in which the LED module 100 is required to be replaced such as in the event of a breakdown of the LED module 100, the LED module 100 may be replaced only by detaching the fixing screws 320 (i.e., it is not necessary to connect a member dedicated to supplying electric power to the LED module 100 or perform wiring or the like), and as a result, it is possible to replace the LED module 100 with a simple process. Further, in the present exemplary embodiment, the tip portion of the electrode rod 310 and the tip portion of the insulating sleeve 330 each have a cylindrical shape, and the engagement hole (i.e., the through hole 210) is formed in a circular shape, such that the hole is easily formed. In addition, five flat portions are made as the base end of the electrode rod 310 has a quadrangular columnar shape, such that a degree of design flexibility is increased when forming the screw hole for connecting a power supply member (not illustrated) or the like to the base end.

While the present exemplary embodiment has been described above, the present disclosure is not limited to the above-mentioned configurations, and various modifications may be made within the scope of the technical spirit of the present disclosure.

For example, in the present exemplary embodiment, the light irradiation device 1 is described as having the circuit board fixing structure 10, but the use of the circuit board fixing structure 10 is not limited thereto, and the circuit board fixing structure 10 may be applied to a device having a configuration in which the circuit board is supported on the base (e.g., the heat sink or the base plate).

In addition, in the present exemplary embodiment, the LED module 100 is fixed by mounting the washers 325 and the fixing screws 320 in the through holes 120, but the washer 325 is not necessarily required as long as an outer diameter of a head portion of the fixing screw 320 is sufficiently larger than the through hole 120.

In addition, the heat sink 200 of the present exemplary embodiment is a plate-shaped member made of metal, but the present disclosure is not limited to this configuration, and for example, the heat sink 200 may be made of an insulating material. Further, in this case, the insulating sleeve 330 configured to insulate the electrode rod 310 and the heat sink 200 is not necessarily required, and the electrode rod 310 may be mounted directly in the through hole 210 of the heat sink 200.

In addition, the tip portion of the electrode rod 310 and the tip portion of the insulating sleeve 330 of the present exemplary embodiment each have a cylindrical shape, but in this configuration, there is a problem in that the electrode rod 310 is rotated when mounting the fixing screw 320. Therefore, the electrode rod 310 and/or the insulating sleeve 330 may have a function of preventing a rotation.

In addition, the light irradiation device 1 of the present exemplary embodiment is described as being configured to emit the ultraviolet rays, but the present disclosure is not limited to the configuration, and the present disclosure may be applied to a light source device configured to emit visible light or infrared light.

Figure 3:
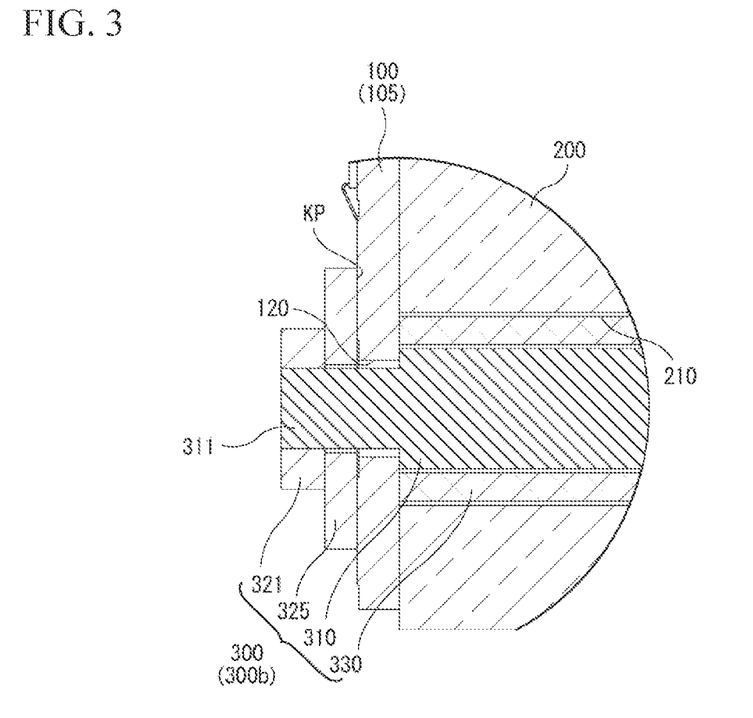
FIG. 3 is a view illustrating a modified example of the circuit board fixing structure according to the first exemplary embodiment of the present disclosure.

In addition, in the present exemplary embodiment, the LED module 100 is fixed by being interposed between the washer 325 and the heat sink 200 by the fixing screw 320, but the present disclosure is not limited to this configuration. For example, as illustrated in FIG. 3, a screw portion 311 is provided on a tip portion of the electrode rod 310, the screw portion 311 is exposed through the through hole 120, and the LED module 100 is fixed between the washer 325 and the heat sink 200 by a nut 321 mounted on the screw portion 311.

Second Exemplary Embodiment

Figure 4:
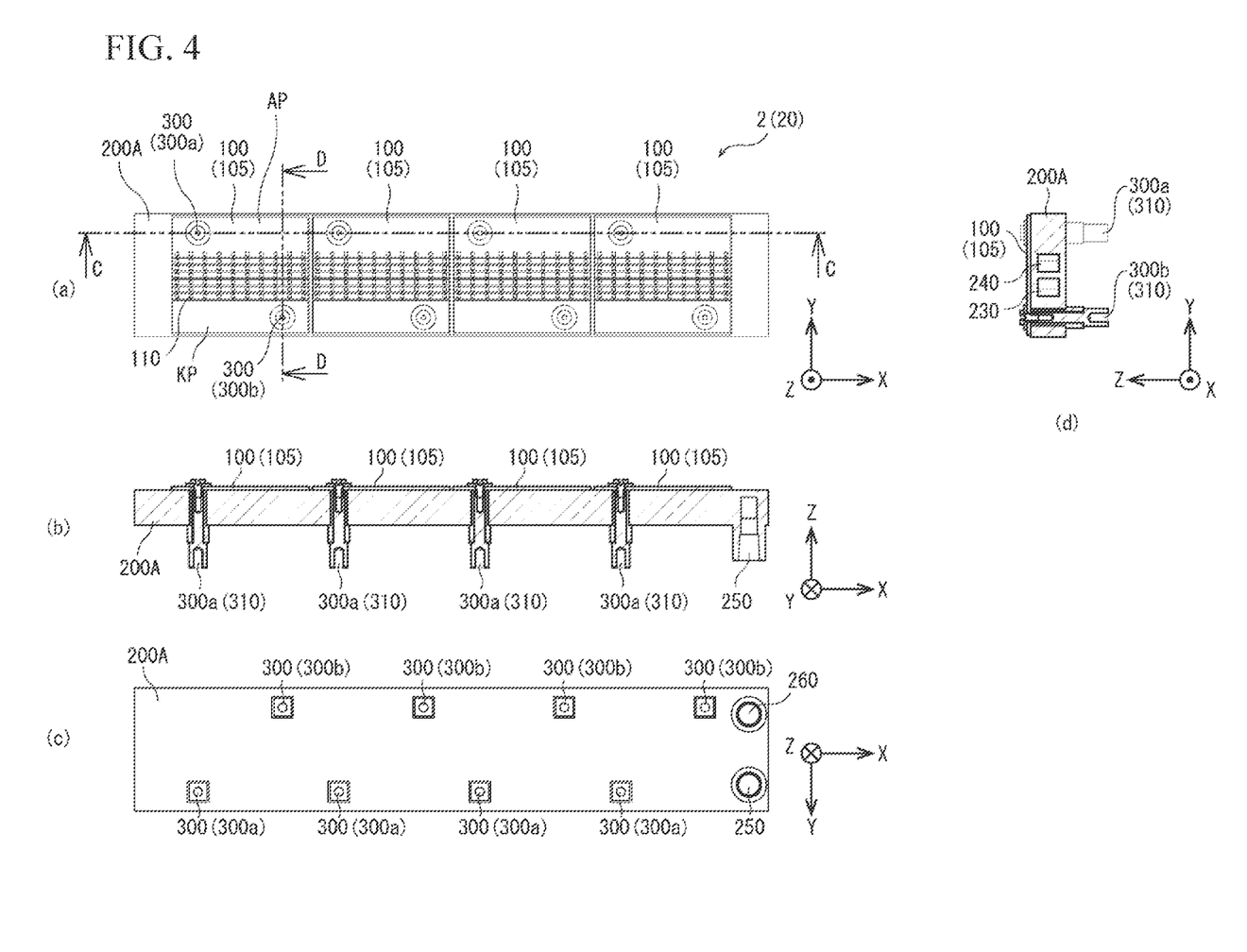
FIG. 4 is a view for explaining a schematic configuration of a light irradiation device having a circuit board fixing structure according to a second exemplary embodiment of the present disclosure.

FIG. 4 is a view for explaining a schematic configuration of a light irradiation device 2 having a circuit board fixing structure 20 according to a second exemplary embodiment of the present disclosure, in which FIG. 4A is a front view, FIG. 4B is a cross-sectional view taken along line C-C in FIG. 4A, FIG. 4C is a rear view, and FIG. 4D is a cross-sectional view taken along line D-D in FIG. 4A.

As illustrated in FIGS. 4B and 4D, the light irradiation device 2 of the present exemplary embodiment differs from the light irradiation device 1 of the first exemplary embodiment in that a water-cooled heat sink 200A is provided.

The heat sink 200A of the present exemplary embodiment has, at a rear surface thereof, a refrigerant supply connector 250 and a refrigerant discharge connector 260 configured to supply/discharge a refrigerant (e.g., water). Further, the refrigerant supplied from the refrigerant supply connector 250 circulates while flowing in flow paths 230 and 240 formed in the heat sink 200A (FIG. 4D) and being discharged from the refrigerant discharge connector 260. In this way, by using the water-cooled heat sink 200A, the respective LED modules 100 may be efficiently cooled.

Third Exemplary Embodiment

Figure 5:
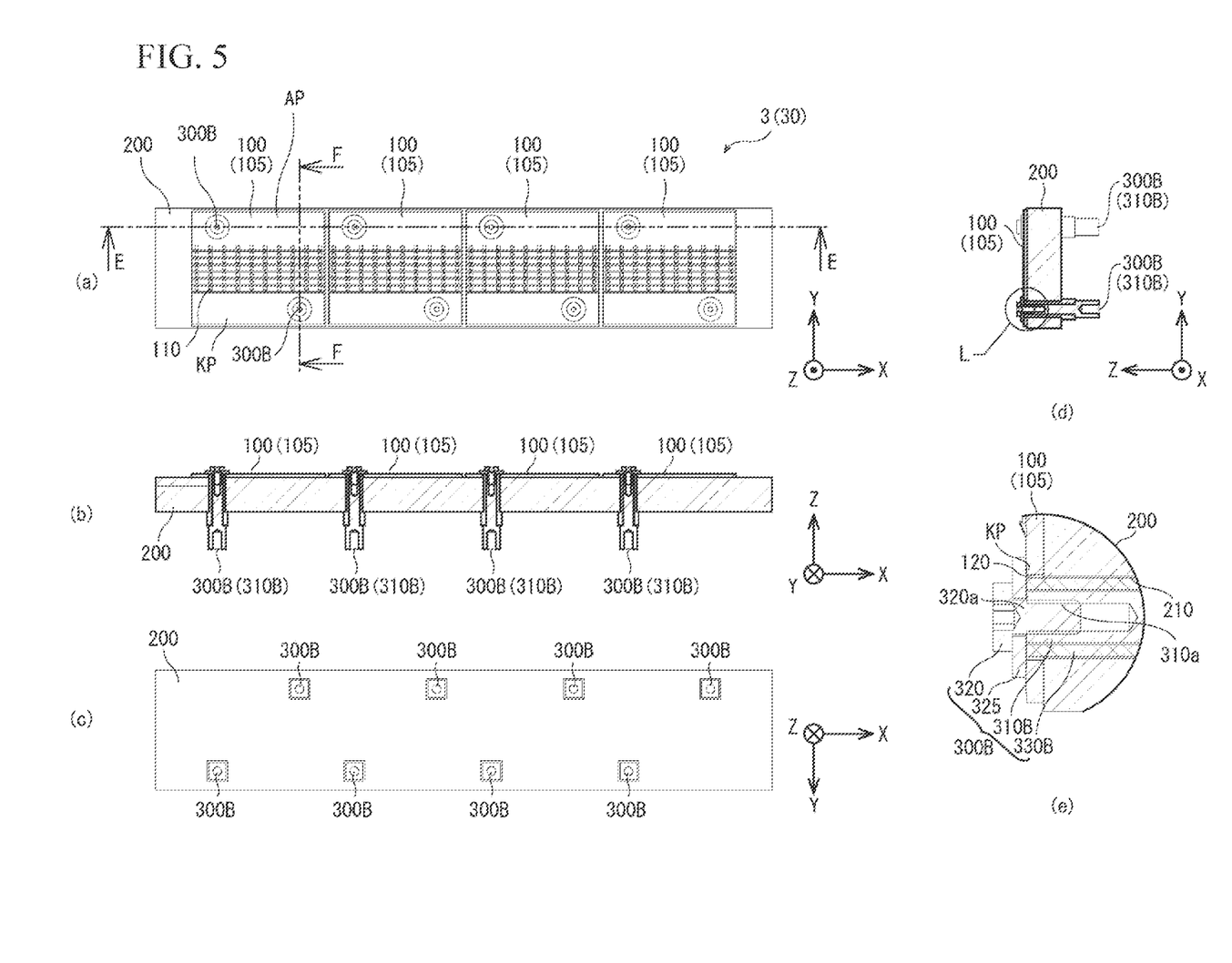
FIG. 5 is a view for explaining a schematic configuration of a light irradiation device having a circuit board fixing structure according to a third exemplary embodiment of the present disclosure.

FIG. 5 is a view for explaining a schematic configuration of a light irradiation device 3 having a circuit board fixing structure 30 according to a third exemplary embodiment of the present disclosure, in which FIG. 5A is a front view, FIG. 5B is a cross-sectional view taken along line E-E in FIG. 5A, FIG. 5C is a rear view, FIG. 5D is a cross-sectional view taken along line F-F in FIG. 5A, and FIG. 5E is an enlarged view of part L in FIG. 5D.

As illustrated in FIG. 5E, the light irradiation device 3 of the present exemplary embodiment differs from the light irradiation device 1 of the first exemplary embodiment in that a tip of an electrode rod 310B and a tip of an insulating sleeve 330B protrude from the surface (placement surface) of the heat sink 200, and the tip of the electrode rod 310B and the tip of the insulating sleeve 330B are fitted into the through hole 120 of the board 105.

In this way, with the configuration in which the tip of the electrode rod 310B and the tip of the insulating sleeve 330B are fitted into the through hole 120 of the board 105, the respective LED modules 100 are automatically positioned on the heat sink 200 when the respective LED modules 100 are placed on the surface (placement surface) of the heat sink 200. In this way, in the present exemplary embodiment, the electrode terminal 300B serves to fix the board 105, supply electric power, and position the board 105.

Fourth Exemplary Embodiment

Figure 6:
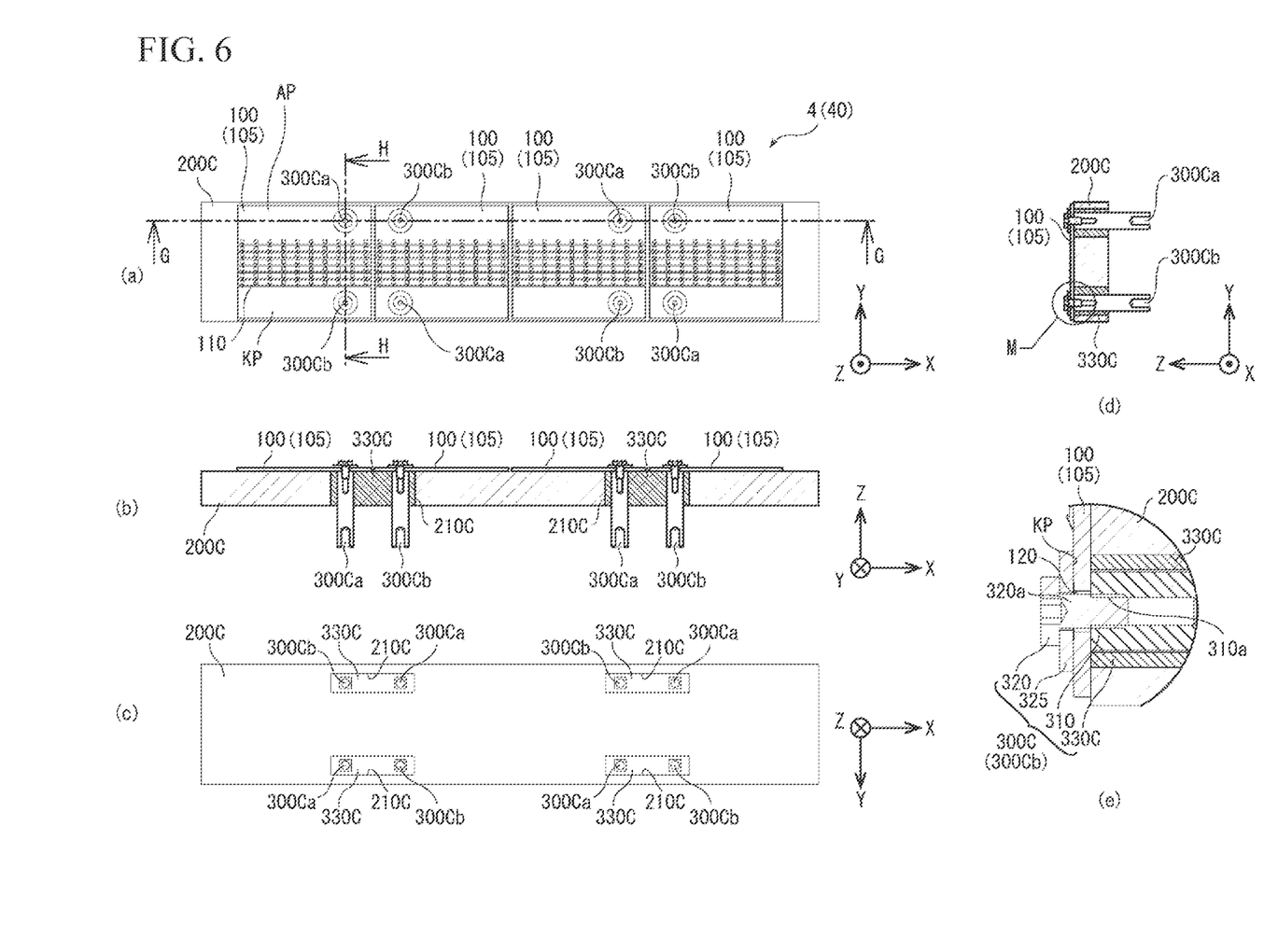
FIG. 6 is a view for explaining a schematic configuration of a light irradiation device having a circuit board fixing structure according to a fourth exemplary embodiment of the present disclosure.

FIG. 6 is a view for explaining a schematic configuration of a light irradiation device 4 having a circuit board fixing structure 40 according to a fourth exemplary embodiment of the present disclosure, in which FIG. 6A is a front view, FIG. 6B is a cross-sectional view taken along line G-G in FIG. 6A, FIG. 6C is a rear view, FIG. 6D is a cross-sectional view taken along line H-H in FIG. 6A, and FIG. 6E is an enlarged view of part M in FIG. 6D.

As illustrated in FIGS. 6B, 6C, 6D, and 6E, the light irradiation device 4 of the present exemplary embodiment differs from the light irradiation device 1 of the first exemplary embodiment in that an anode terminal 300Ca and a cathode terminal 300Cb configured to supply electric power to the respective LED modules 100 are disposed to be adjacent to the anode terminal 300Ca and the cathode terminal 300Cb configured to supply electric power to the adjacent LED module 100, and the anode terminal 300Ca and the cathode terminal 300Cb are mounted to be supported by an insulating member 330C having an approximately rectangular parallelepiped shape and then mounted in a rectangular through hole 210C formed in a heat sink 200C.

In this way, in the present exemplary embodiment, when the anode terminal 300Ca and the cathode terminal 300Cb are mounted in advance on the insulating member 330C and then mounted on the heat sink 200C, the multiple terminals (the anode terminal 300Ca and the cathode terminal 300Cb) are put together, such that the assembly and the wiring are easily performed. In addition, since the assembly may be performed after completely fixing the anode terminal 300Ca and the cathode terminal 300Cb to the insulating member 330C, a positional deviation in a rotation direction of the anode terminal 300Ca and the cathode terminal 300Cb may be inhibited, and the LED module 100 and the heat sink 200C may be more rigidly fixed. Further, in the present exemplary embodiment, the single anode terminal 300Ca and the single cathode terminal 300Cb are supported by the insulating member 330C, but more anode terminals 300Ca and more cathode terminals 300Cb may be supported by the insulating member 330C.

Further, the exemplary embodiments disclosed herein are illustrative in all aspects and do not limit the present disclosure. The scope of the present disclosure is defined by the claims instead of the above-mentioned descriptions, and all modifications within the equivalent scope and meanings to the claims belong to the scope of the present disclosure.

The invention claimed is:

1. A circuit board fixing structure configured to fix a circuit board onto a surface of a base, the circuit board fixing structure comprising:
   a wire pattern formed on a surface of the circuit board;
   a first through hole penetrating from a front surface to a rear surface of the circuit board;
   a second through hole penetrating from a front surface to a rear surface of the base so as to communicate with the first through hole;

an electrode penetratively inserted into the second through hole; and a fixing member engaged with the electrode mounted on the surface of the circuit board and configured to fix the circuit board to the base, wherein when the fixing member and the electrode are engaged, the wire pattern and the electrode are electrically connected through the fixing member;

wherein, when the electrode is mounted in the second through hole, a tip of the electrode is positioned on substantially a same plane as the front surface of the base, and a base end of the electrode is disposed to protrude from the rear surface of the base.

2. The circuit board fixing structure of claim 1, wherein an end of the electrode at a side of the circuit board is fitted with the first through hole.

3. The circuit board fixing structure of claim 2, wherein the base has conductivity and wherein the circuit board fixing structure further has, in the second through hole, an insulating member configured to insulate the electrode and the base.

4. The circuit board fixing structure of claim 3, wherein the multiple electrodes are provided, and the insulating member is formed to support the multiple electrodes.

5. The circuit board fixing structure of claim 1, wherein the base has conductivity and wherein the circuit board fixing structure further has, in the second through hole, an insulating member configured to insulate the electrode and the base.

6. The circuit board fixing structure of claim 5, wherein the multiple electrodes are provided, and the insulating member is formed to support the multiple electrodes.

7. The circuit board fixing structure of claim 1, wherein the base has insulation.

8. The circuit board fixing structure of claim 1, wherein the fixing member is a screw, and the electrode has a screw hole thread-coupled to the screw.

9. The circuit board fixing structure of claim 1, wherein the base is a heat sink configured to cool the circuit board.

10. The circuit board fixing structure of claim 1, wherein the rear surface of the circuit board is in contact with the front surface of the base.

11. A light irradiation device comprising:
a circuit board fixing structure configured to fix a circuit board onto a surface of a base; and
multiple light emitting elements disposed on the circuit board,
wherein the circuit board fixing structure comprises,
a wire pattern formed on a surface of the circuit board;
a first through hole penetrating from a front surface to a rear surface of the circuit board;
a second through hole penetrating from a front surface to a rear surface of the base so as to communicate with the first through hole;
an electrode penetratively inserted into the second through hole; and
a fixing member engaged with the electrode mounted on the surface of the circuit board and configured to fix the circuit board to the base, wherein when the fixing member and the electrode are engaged, the wire pattern and the electrode are electrically connected through the fixing member;
wherein, when the electrode is mounted in the second through hole, a tip of the electrode is positioned on substantially a same plane as the front surface of the base, and a base end of the electrode is disposed to protrude from the rear surface of the base.

12. The light irradiation device of claim 11, wherein light emitted from the light emitting element is light having a wavelength in an ultraviolet region.

13. The light irradiation device of claim 11, wherein an end of the electrode at a side of the circuit board is fitted with the first through hole.

14. The light irradiation device of claim 13, wherein the base has conductivity and wherein the circuit board fixing structure further has, in the second through hole, an insulating member configured to insulate the electrode and the base.

15. The light irradiation device of claim 14, wherein the multiple electrodes are provided, and the insulating member is formed to support the multiple electrodes.

16. The light irradiation device of claim 11, wherein the base has conductivity and wherein the circuit board fixing structure further has, in the second through hole, an insulating member configured to insulate the electrode and the base.

17. The light irradiation device of claim 16, wherein the multiple electrodes are provided, and the insulating member is formed to support the multiple electrodes.

18. The light irradiation device of claim 11, wherein the base has insulation.

19. The light irradiation device of claim 11, wherein the fixing member is a screw, and the electrode has a screw hole thread-coupled to the screw.

20. The light irradiation device of claim 11, wherein the base is a heat sink configured to cool the circuit board.

* * * * *